(12) United States Patent
Alvi et al.

(10) Patent No.: US 12,424,929 B2
(45) Date of Patent: Sep. 23, 2025

(54) ELECTRONIC CONTROL OF PROTECTION PARAMETERS FOR A SEMICONDUCTOR SWITCH

(71) Applicant: GM GLOBAL TECHNOLOGY OPERATIONS LLC, Detroit, MI (US)

(72) Inventors: Muhammad Hussain Alvi, Troy, MI (US); Junghoon Kim, Ann Arbor, MI (US); Chunhao J. Lee, Troy, MI (US); Brian A. Welchko, Oakland Township, MI (US); Eric Bernard Gach, Clarkston, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 302 days.

(21) Appl. No.: 18/305,797

(22) Filed: Apr. 24, 2023

(65) Prior Publication Data

US 2024/0356458 A1 Oct. 24, 2024

(51) Int. Cl.
*H02M 1/32* (2007.01)
*B60L 3/00* (2019.01)
*H02H 5/04* (2006.01)
*H02M 7/5387* (2007.01)

(52) U.S. Cl.
CPC ............... *H02M 1/32* (2013.01); *B60L 3/003* (2013.01); *H02H 5/041* (2013.01); *H02M 1/325* (2021.05); *B60L 2210/42* (2013.01); *H02M 7/53871* (2013.01)

(58) Field of Classification Search
CPC ............ H02M 1/32; B60L 3/003; H02H 3/20; H02H 3/08; H02H 3/083; H02H 3/38; H02H 5/04; H02H 5/041
See application file for complete search history.

(56) References Cited

U.S. PATENT DOCUMENTS

| | | | |
|---|---|---|---|
| 11,128,290 B2* | 9/2021 | Aeloiza | H03K 5/24 |
| 11,736,101 B2* | 8/2023 | Schulz-Linkholt | G06F 11/0757 361/93.2 |
| 2008/0304189 A1* | 12/2008 | Tang | H02H 7/1222 318/434 |
| 2010/0046123 A1* | 2/2010 | Fukami | H03K 17/0822 361/18 |
| 2023/0086132 A1* | 3/2023 | Miyazaki | H02M 1/0009 361/101 |
| 2024/0258789 A1* | 8/2024 | Nakano | H02M 1/327 |

* cited by examiner

*Primary Examiner* — Alex Torres-Rivera
(74) *Attorney, Agent, or Firm* — CANTOR COLBURN LLP

(57) ABSTRACT

A system includes an electronic device including a circuit having a semiconductor switch, and a controller configured to control a gate driver connected to the semiconductor switch via a protection circuit. The controller is configured to set a protection parameter including a voltage threshold representing a selected value of a voltage across the semiconductor switch, the protection parameter configured to cause the semiconductor switch to be deactivated in response to an overcurrent condition, the protection parameter selected based on a mathematical model of the semiconductor switch, the mathematical model representing a physical property of at least one of the electronic device and the semiconductor switch.

20 Claims, 7 Drawing Sheets

ELECTRONIC CONTROL OF PROTECTION PARAMETERS FOR A SEMICONDUCTOR SWITCH

INTRODUCTION

The subject disclosure relates to switching devices, and more particularly to controlling protection circuits connected to switching devices.

High speed switching devices are used in a variety of applications. For example, electric and hybrid electric vehicles feature conversion devices such as direction current (DC)-DC converters and inverters, which feature semiconductor switches. Such devices are used to control power supplied from battery storage to electric motors, electronics and other vehicle subsystems. Control systems for semiconductor switches typically include some form of protection, such as a desaturation circuit, to prevent overcurrent or short circuit conditions that can cause damage and/or degradation.

SUMMARY

In one exemplary embodiment, a system includes an electronic device including a circuit having a semiconductor switch, and a controller configured to control a gate driver connected to the semiconductor switch via a protection circuit. The controller is configured to set a protection parameter including a voltage threshold representing a selected value of a voltage across the semiconductor switch, the protection parameter configured to cause the semiconductor switch to be deactivated in response to an overcurrent condition, the protection parameter selected based on a mathematical model of the semiconductor switch, the mathematical model representing a physical property of at least one of the electronic device and the semiconductor switch.

In addition to one or more of the features described herein, the mathematical model is a physics-based semiconductor model, the semiconductor model prescribing a value of the protection parameter based on a temperature of the semiconductor switch, a phase of current applied to the semiconductor switch for controlling the semiconductor switch, and a ripple current.

In addition to one or more of the features described herein, the mathematical model includes a thermal model of a junction temperature of the semiconductor switch, and a torque speed model including a torque speed operating point.

In addition to one or more of the features described herein, the controller is configured to update the protection parameter at each of a plurality of switching cycles.

In addition to one or more of the features described herein, the protection parameter includes a blanking time.

In addition to one or more of the features described herein, the controller is configured to select the blanking time by controlling at least one of a charging current and a capacitance of a capacitor.

In addition to one or more of the features described herein, the protection parameter includes a threshold desaturation voltage of the protection circuit.

In addition to one or more of the features described herein, the controller is configured to adjust the voltage threshold by controlling at least one of a charging current, a resistance of a variable resistor and an internal comparator threshold.

In another exemplary embodiment, a method includes controlling a semiconductor switch of an electronic device during a switching cycle by a gate driver connected to the semiconductor switch via a protection circuit, monitoring a voltage across the semiconductor switch during the switch cycle, and comparing the voltage across the semiconductor switch to a protection parameter, the protection parameter including a voltage threshold representing a selected value of a voltage across the semiconductor switch. The method also includes, based on an overcurrent condition causing the voltage of the semiconductor switch to exceed the voltage threshold, deactivating the semiconductor switch, where the protection parameter is selected based on a mathematical model of the switch, the mathematical model representing a physical property of at least one of the electronic device and the semiconductor switch.

In addition to one or more of the features described herein, the mathematical model is a physics-based semiconductor model, the semiconductor model prescribing a value of the protection parameter based on a temperature of the semiconductor switch, a phase of current applied to the semiconductor switch for controlling the semiconductor switch, and a ripple current.

In addition to one or more of the features described herein, the mathematical model includes a thermal model of a junction temperature of the semiconductor switch, and a torque speed model including a torque speed operating point.

In addition to one or more of the features described herein, the method further includes updating the protection parameter at each of a plurality of switching cycles.

In addition to one or more of the features described herein, the protection parameter includes a blanking time, the blanking time selected by controlling at least one of a charging current and a capacitance of a capacitor.

In addition to one or more of the features described herein, the protection parameter includes a threshold desaturation voltage of the protection circuit.

In addition to one or more of the features described herein, the electronic device is disposed in a vehicle, and the method further includes wirelessly transmitting the protection parameter to an external location for remote monitoring of the electronic device.

In yet another exemplary embodiment, a system of a vehicle includes an electronic device including a circuit having a semiconductor switch, a gate driver connected to the semiconductor switch via a protection circuit, and a controller configured to control the gate driver and set a protection parameter including a voltage threshold representing a selected value of a voltage across the semiconductor switch. The protection parameter is configured to cause the semiconductor switch to be deactivated in response to an overcurrent condition, the protection parameter selected based on a mathematical model of the semiconductor switch, the mathematical model representing a physical property of at least one of the electronic device and the semiconductor switch.

In addition to one or more of the features described herein, the mathematical model is a physics-based semiconductor model, the semiconductor model prescribing a value of the protection parameter based on a temperature of the semiconductor switch, a phase of current applied to the semiconductor switch for controlling the semiconductor switch, and a ripple current.

In addition to one or more of the features described herein, the mathematical model includes a thermal model of a junction temperature of the semiconductor switch, and a torque speed model including a torque speed operating point.

In addition to one or more of the features described herein, the protection parameter includes a blanking time, and the controller is configured to select the blanking time by controlling at least one of a charging current and a capacitance of a capacitor.

In addition to one or more of the features described herein, the protection parameter includes a threshold desaturation voltage of the protection circuit.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
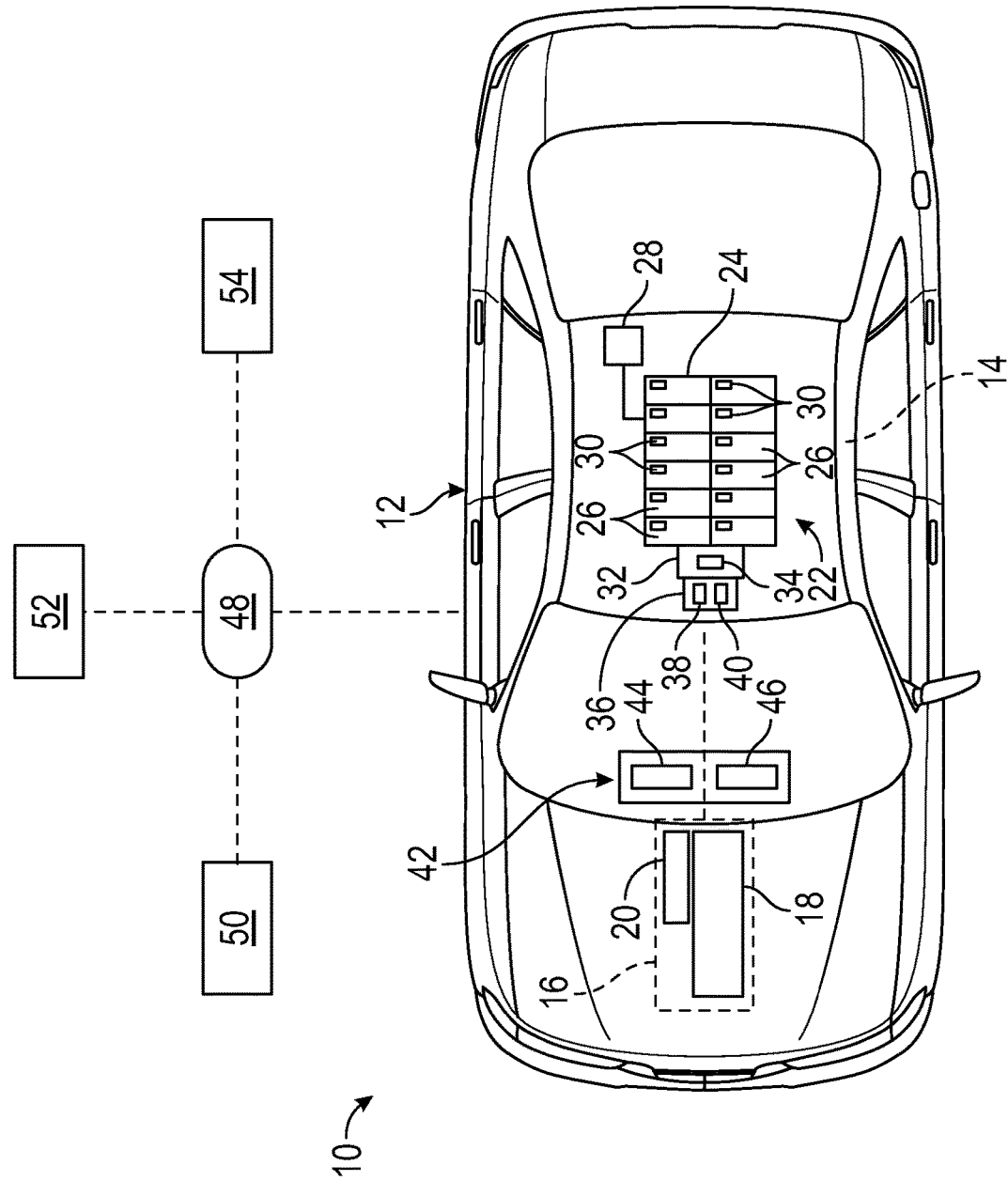
FIG. 1 is a top schematic view of a motor vehicle including a battery assembly and a switching control system, in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with one or more exemplary embodiments, methods, devices and systems are provided for controlling operation of a semiconductor switch or other electronic switch, such as a metal-oxide semiconductor field effect transistor (MOSFET) or insulated-gate bipolar transistor (IGBT). An embodiment of a switching control system includes a switch control device (e.g., a gate driver) operably connected to a circuit having one or more semiconductor switches, such as a DC-DC converter, inverter or other conversion device of a vehicle.

In an embodiment, the switch control device includes a gate driver or other controller that is operably connected to a gate of a semiconductor switching device (i.e., switch) and is configured to control operation of one or more switches. For example, the switch control device controls switching cycles during pulse width modulation (PWM) control of an inverter or other component. It is noted that the switch control device may be used in conjunction with any desired electronic component or device, and is not limited to use with examples described herein.

The switch control device also includes a protection circuit that protects a switch by opening or deactivating the switch based on occurrence of an overcurrent or overvoltage condition that could cause a short circuit. In an embodiment, the protection circuit includes a desaturation circuit. The desaturation circuit performs functions such as noise suppression, monitoring switch voltage, triggering fault or short-circuit protection (e.g., turning off a switch and/or electronic component), and establishing blanking times.

In an embodiment, the switch control device is configured to dynamically calculate or select one or more protection parameters that control conditions under which an over current condition is detected. The protection parameters include, for example, a switch voltage threshold and a blanking time.

The switch control device uses one or more mathematical physics-based models that describe physical properties and behavior of the switch and/or other components. For example, the switch control device receives parameters such as temperature, drive currents, direct current (DC) voltage, peak phase current and others. The received parameters are input to models that include a thermal model of the switch, a semiconductor model of the switch, and models related to other components (e.g., electric motor, conversion device etc.), and protection parameters are calculated therefrom. The protection parameters may be calculated or updated periodically, continuously or otherwise. For example, the switch control device calculates protection parameters at each switching cycle of an inverter or other conversion device, and updates the protection parameters as needed.

Embodiments described herein present numerous advantages and technical effects. For example, the embodiments provide for precise detection of overcurrent faults and semiconductor degradation, without triggering false fault indicators. The embodiments provides software flexibility to update protection parameters (e.g., thresholds) and provide diagnostics related to semiconductor deterioration. In this way, protection parameters are dynamically updated so that trigger margins are minimized. In addition, the embodiments provide for precise control without the need to make significant hardware changes. Furthermore, as embodiments utilize models that are dynamically updated, the embodiments provide additional flexibility and responsiveness as compared to systems that use a single hardware-tuned model.

For example, in vehicle inverters, it is typically desired to switch as fast as possible. Wide bandgap (WGB) semiconductors used in inverters can sustain fault or short circuit conditions for short periods of time, such as about 3 μs or less. Typical protection devices set a blanking time based on hardware, which is fixed for all conditions. As conditions change due to, for example, switch degradation and changes in operating parameters, the voltage threshold and blanking time needed can also change. Embodiments are able to account for such changes and tailor protection parameters to different conditions, which results in reduced cost and reduction of false triggers.

The embodiments are not limited to use with any specific vehicle or device or system that utilizes battery assemblies, and may be applicable to various contexts. For example, the embodiments may be used with automobiles, trucks, aircraft, construction equipment, farm equipment, automated factory equipment and/or any other device or system that may use electronic devices having semiconductor switches.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, a fuel injection subsystem, an exhaust subsystem and others.

The vehicle may be a combustion engine vehicle, an electrically powered vehicle (EV) or a hybrid electric vehicle (HEV). In an example, the vehicle 10 is a hybrid vehicle that includes a combustion engine 18 and an electric motor 20.

The vehicle 10 includes a battery system 22, which may be electrically connected to the motor 20 and/or other components, such as vehicle electronics. In an embodiment, the battery system 22 includes a battery assembly such as a high voltage battery pack 24 having a plurality of battery modules 26. Each of the battery modules 26 includes a number of individual cells (not shown). The battery system 22 may also include a monitoring unit 28 configured to receive measurements from sensors 30. Each sensor 30 may be an assembly or system having one or more sensors for measuring various battery and environmental parameters, such as temperature, current and voltages. The monitoring unit 28 includes components such as a processor, memory, an interface, a bus and/or other suitable components.

The battery system 22 includes various conversion devices for controlling the supply of power from the battery pack 24 to the motor 20 and/or electronic components. The conversion devices include a DC-DC converter module 32 that is electrically connected to the battery system 22 and includes a DC-DC converter circuit (converter) 34.

The conversion devices also include an inverter module 36 that includes an inverter 38 and a switching control system 40. The inverter 38 receives DC power from the DC-DC converter 34 and converts direct current (DC) power to alternating current (AC) power that is supplied to the electric motor 20. The inverter 38 includes one or more sets of switches or switching devices (e.g., controllable semiconductor switches such as MOSFETs) that are controllable to supply AC power to each phase of the motor 20.

The switching control system 40 includes one or more switch control devices that are configured to control semiconductor switching during operation of the inverter 38 and the DC-DC converter 34. Switching is controlled according to switching cycles, during which switches are selectively opened and closed to provide three-phase alternating current to the motor 20. The switching control system 40 may be part of the same component as shown in FIG. 1, or may be incorporated into a separate component.

The vehicle 10 also includes a computer system 42 that includes one or more processing devices 44 and a user interface 46. The various processing devices and units may communicate with one another via a communication device or system, such as fast parallel communication, a controller area network (CAN) or transmission control protocol (TCP) bus.

The monitoring unit 28, the inverter module 36, the switching control system 40, the computer system 42 and/or other processing components in the vehicle 10 (e.g., a vehicle control unit) may be configured to communicate with various remote devices and systems such as remote servers and other vehicles. Such communication can be realized, for example, via a network 48 (e.g., cellular network, etc.) and/or via wireless communication. For example, the vehicle 10 may communicate with one or more other vehicles 50, a remote entity 52 (e.g., a workstation, a computer, a server, a service provider, fleet management or monitoring system, etc.), and/or a database or other storage location 54.

Figure 2:
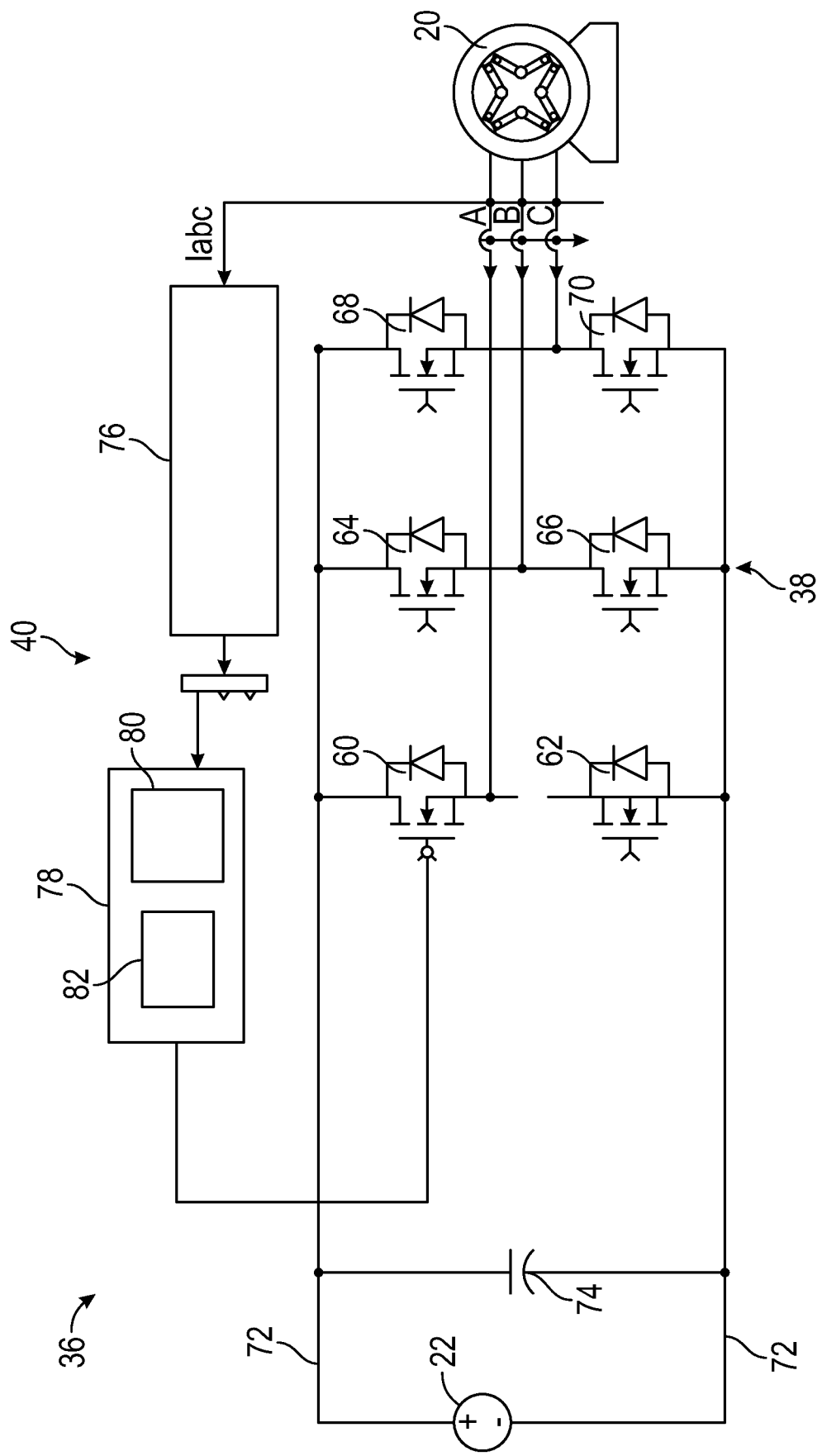
FIG. 2 depicts a conversion device and a switching control system including a gate drive circuit, a protection circuit and a controller, in accordance with an exemplary embodiment.

FIG. 2 depicts an embodiment of the inverter module 36 including the inverter (inverter circuit) 38 and the switching control system 40. The inverter 38 includes a switching assembly including at least one inverter switch connected to each phase of a three-phase electric motor, such as the motor 20. A first switching assembly includes an inverter switch 60 and an inverter switch 62 connected as a half-bridge to a first phase (phase A), a second switching assembly includes an inverter switch 64 and an inverter switch 66 connected to a second phase (phase B), and a third switching assembly includes an inverter switch 68 and an inverter switch 70 connected to a third phase (phase C).

In an embodiment, each inverter switch is a semiconductor switch. As non-limiting examples, inverter switches may include metal-oxide-semiconductor (MOS)-controlled Thyristors (MCTs), gallium-nitride (GaN) field-effect transistors (FETs), metal-oxide-semiconductor field-effect transistors (MOSFETs), silicon carbide junction field-effect transistors (SiC JFETs), insulated-gate bipolar transistors (IGBTs) or any other suitable low loss device of suitable voltage and current ratings.

The switching assemblies are connected to the battery system 22 by a DC propulsion bus 72. Additional components may be included, such as a bulk capacitor 74 (Xcap) for stabilizing voltage.

The switching control system 40 includes a controller 76 connected to a gate driver 78. The controller 76 receives phase current measurements from each phase (Iabc) and outputs control signals to drive the switch 60. Although the controller 76 is only shown as connected to the switch 60, it is to be understood that the controller 76 may be connected to drivers of each other inverter switch in the inverter 38. In addition, it is noted that, although not shown, each switch may be connected to a respective gate driver 78.

The gate driver 78 includes or is connected to components for protecting switches from overcurrent, overvoltage and/or other conditions that can cause damage, degradation or sub-optimal operation. In an embodiment, the gate driver 78 includes a drive circuit 80 for controlling operation of the switch 60 and/or other switches, and a desaturation protection circuit 82.

Figure 3:
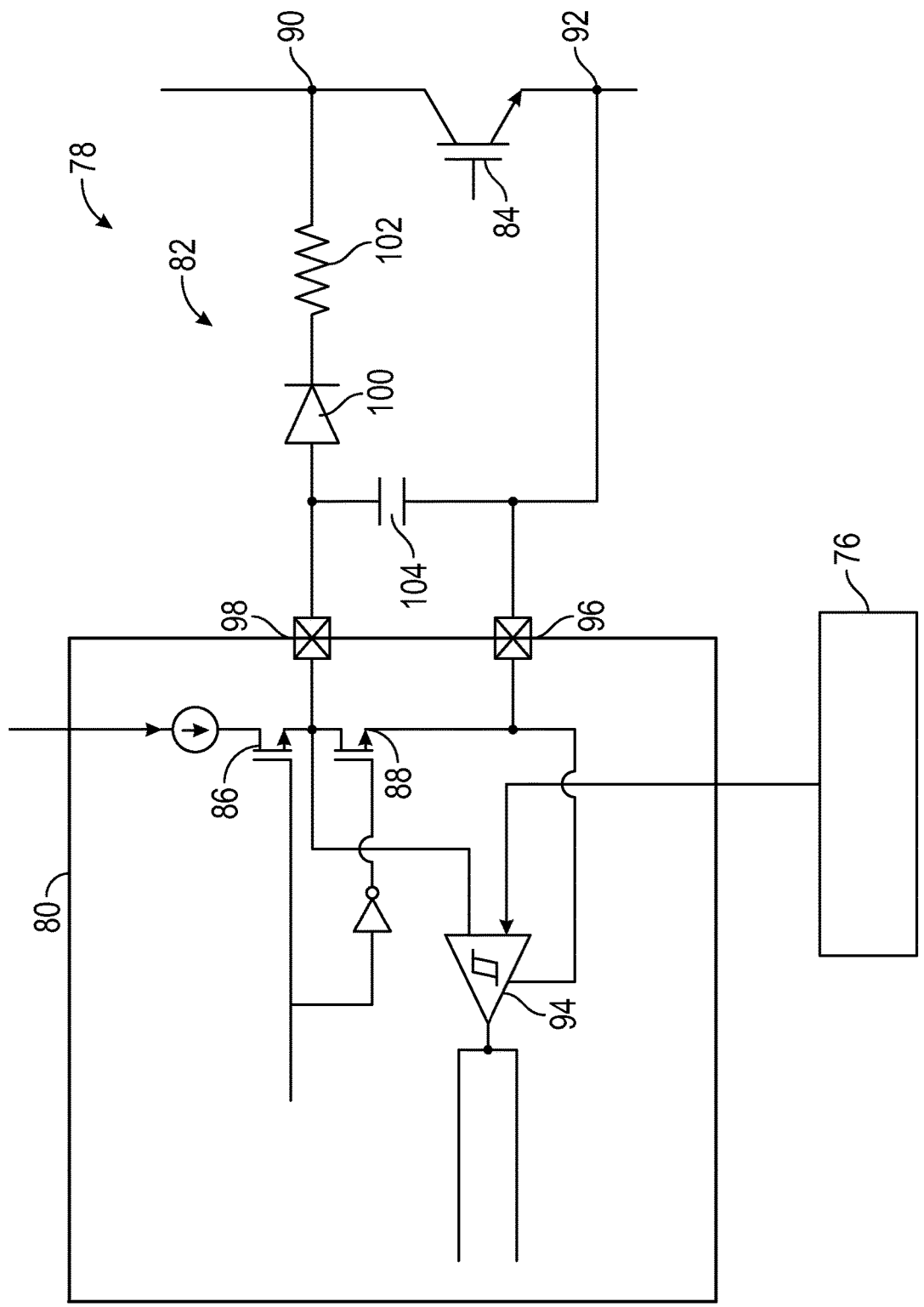
FIG. 3 depicts a gate driver including a gate drive circuit and a protection circuit, in accordance with an exemplary embodiment.

FIG. 3 depicts an embodiment of the gate driver 78 and the desaturation protection circuit 82, which is connected to a semiconductor switch 84, such as an IGBT as shown, or a MOSFET. The drive circuit 80 is an isolated circuit that includes half bridge switching elements 86 and 88 operable by a control signal. The control signal may be provided by the controller 76 or other suitable processor according to a PWM or other switching scheme.

The switch 84 includes a drain terminal 90 (collector) and a source terminal 92 (emitter). The voltage across the drain terminal 90 and the source terminal 92 defines a switch voltage Vds. A resistance of the switch 84 is denoted Rds and current through the switch 84 is denoted Ids.

The drive circuit 80 also includes a sensing circuit for detecting short circuit or fault conditions, which is used by the gate driver 80 to deactivate the switch 84 in response to detecting a voltage that is greater than a selected voltage threshold. The sensing circuit includes a comparator 94 (op-amp) for detecting the switch voltage Vds and comparing the detected switch voltage to a threshold defined by software-based protection methods as described herein.

The gate driver 80 is connected to the switch 84 via the protection circuit 82, which provides desaturation protection to the switch 84. The gate driver 80 includes a source input terminal 96 that receives a source voltage, and a desaturation input (DSAT) terminal 98 that receives a protection circuit voltage Vdd.

The protection circuit 82 includes a desaturation diode ($D_{DSAT}$) 100 in series with a desaturation resistor ($R_{DSAT}$) 102, and a capacitor 104. The desaturation resistor 102 fine-tunes the switch voltage and delivers the fine-tuned switch voltage to the capacitor 104. The resistor 102 has a resistance that is selected to set the voltage at the terminal 98 to a targeted value.

An occurring fault indicated by the switch voltage appears across the capacitor 104, and is input to the gate drive circuit 80 via the DSAT terminal 98. The gate drive circuit, in response, shuts down the switch 84.

During normal operation, the switch 84 is in saturation, and the charging current Ich flows through the diode 100 to the drain terminal (collector) 90, leading the capacitor 104 to charge to a low value proportional to Vds. During a short circuit condition, the Vds is much higher than normal, and the charging current Ich charges the capacitor 104 much higher due to the high Vds. After a period of time to charge 104 (the blanking time), the voltage Vdd exceeds a set voltage threshold Vth,DESAT, and the comparator 94 detects a fault.

The desaturation capacitor 104, in an embodiment, operates to provide a blanking time when the switch 84 is activated (i.e., closed or turned on) so that high switch voltages or transients do not cause a false short detection. The blanking time is an amount of time that it takes for the capacitor 104 to charge and for the protection circuit voltage Vdd to reach a voltage threshold value (denoted as Vth, DESAT), and trigger a shutdown or other action.

The protection circuit voltage for Vds can be determined based on if the diode 100 is ideal:

$$V_{dd} = I_{ch} \times R_{DSAT},$$

where Ich is the charging current, and $R_{DSAT}$ is the resistance of the resistor 102.

The blanking time ($t_{blk}$) can be calculated as follows:

$$t_{blk} = \frac{V_{th,DESAT} \times C_{BL}}{I_{ch}},$$

where $C_{BL}$ is the capacitance of the capacitor 104.

The resistor 102, in an embodiment, is positioned relative to the drive circuit 80 (e.g., in the inverter module 36) so that the resistance changes in accordance with die temperature, and so that the resistor 102 is not in the loop of high voltage current.

During a short circuit condition, overcurrent can create significant heating, which can damage the switch and/or die on which the switch is mounted. By changing the capacitance $C_{BL}$, and/or the charging current $I_{ch}$, the blanking time is set and is a function of charging current and capacitance as noted above.

The voltage threshold Vth, DESAT can be varied by the controller 76 in a number of ways. The voltage threshold Vth, DESAT is a function of parameters that include the charging current Ich, the capacitance $C_{BL}$ and the resistance $R_{DSAT}$. By changing the parameters, the threshold can be changed to adapt to changing conditions.

In an embodiment, a variable current source is included that allows for control of the current used to charge the capacitor 104 and drive the protection. By controlling the charging current Ich, the threshold $V_{th,DESAT}$ can be changed. For example, increasing the charging current decreases the voltage threshold, and decreasing the charging current increases the voltage threshold. In an embodiment, the controller 76 can set or change the voltage threshold by computing a desired internal protection threshold value used by the comparator 94.

The resistor 102 and/or the capacitor 104 may be variable. This allows the controller 76 to adjust the voltage threshold by changing the resistance $R_{DSAT}$. Various components may be used for controlling resistance, such as a tunnel magneto resistors and variable resistors. The capacitance $C_{BL}$ and/or the resistance $R_{DSAT}$ may also be controlled using a variable capacitor to set the blanking time.

In an embodiment, the controller 76 or other suitable processor is configured to control the protection circuit 82 and protection parameters based on one or more mathematical models. The model(s) simulate physical properties and behavior of the switch and other components.

Figure 4:
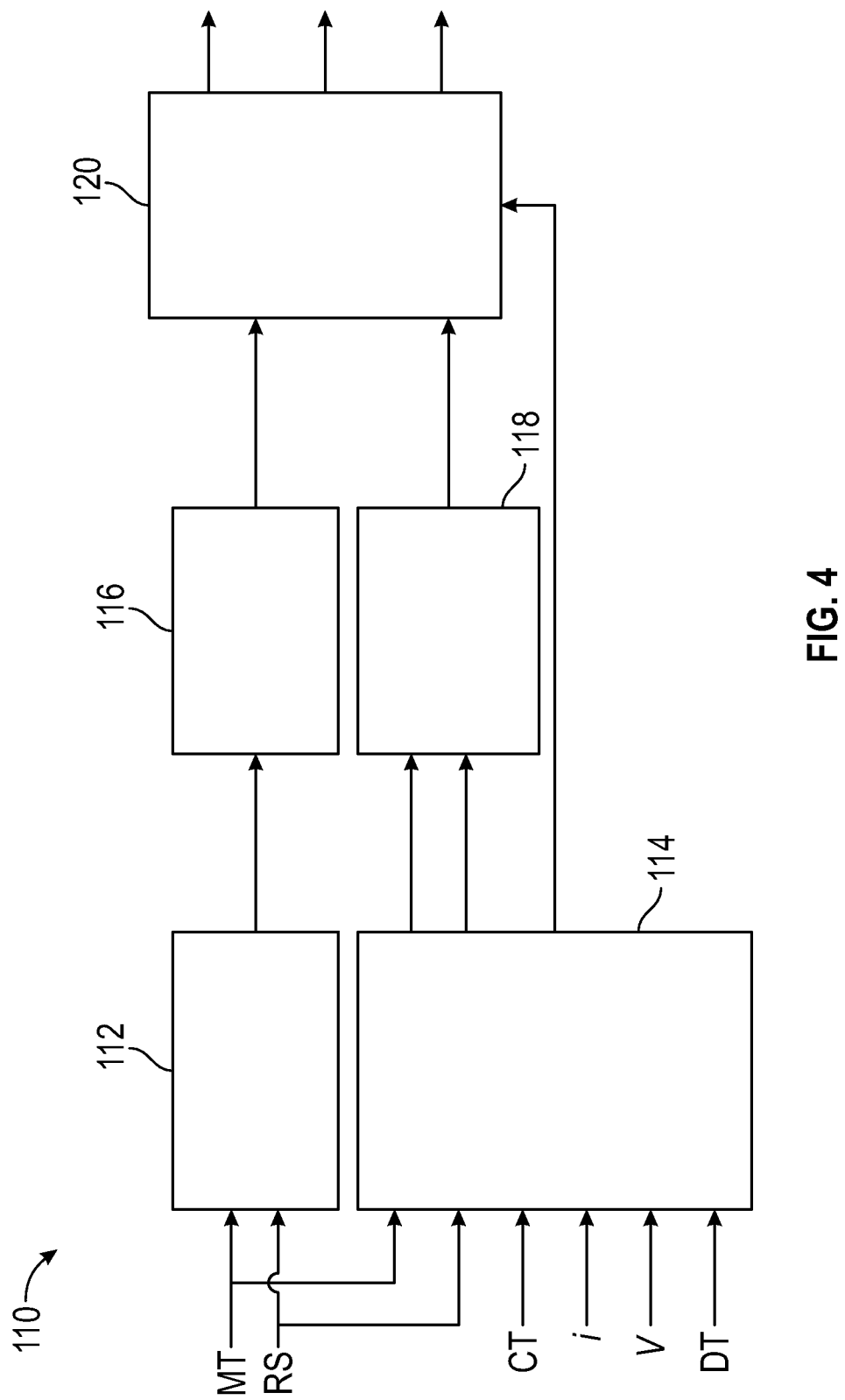
FIG. 4 depicts examples of mathematical models used to calculate or select protection parameters, in accordance with an exemplary embodiment.

FIG. 4 depicts an example of a set of physics-based models 110 that can be used to calculate protection parameters. It is noted that the set of models is not limited to this example, as the number and/or types of models are not limited.

In this example, the set of models includes a maximum torque map 112, which prescribes a maximum torque of a vehicle motor (e.g., the motor 20) as a function of current (i.e., max torque per amp). The maximum torque map 112 may be configured as a lookup table (LUT) or provided in any suitable data structure.

A power inverter loss model 114 describes inverter power loss as a function of switching frequency, current or other operational and material parameter. A switching cycle and motor flux map 116 describes magnetic flux in a motor connected to the inverter. It is noted that the models 114 and 116 may be provided based on any electronic device that utilizes semiconductor switches, such as a DC-DC converter. Other physics-based models may be used, such as a thermal model 118 of the switch/inverter.

In an embodiment, parameters including temperature and current are input to a semiconductor model 120 that describes electrical properties of the switch under various operating conditions.

Figure 5A:
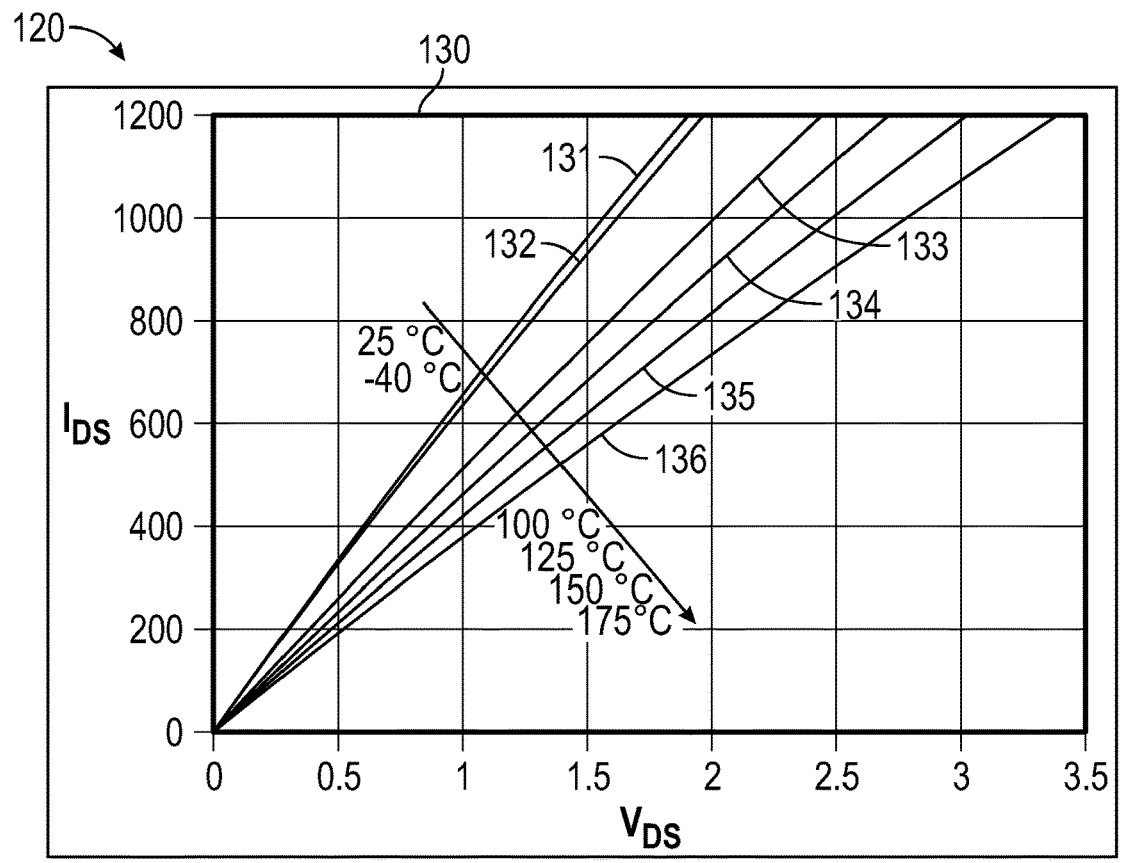
FIGS. 5A-5C depict a semiconductor model for a switch, in accordance with an exemplary embodiment.
Figure 5B:
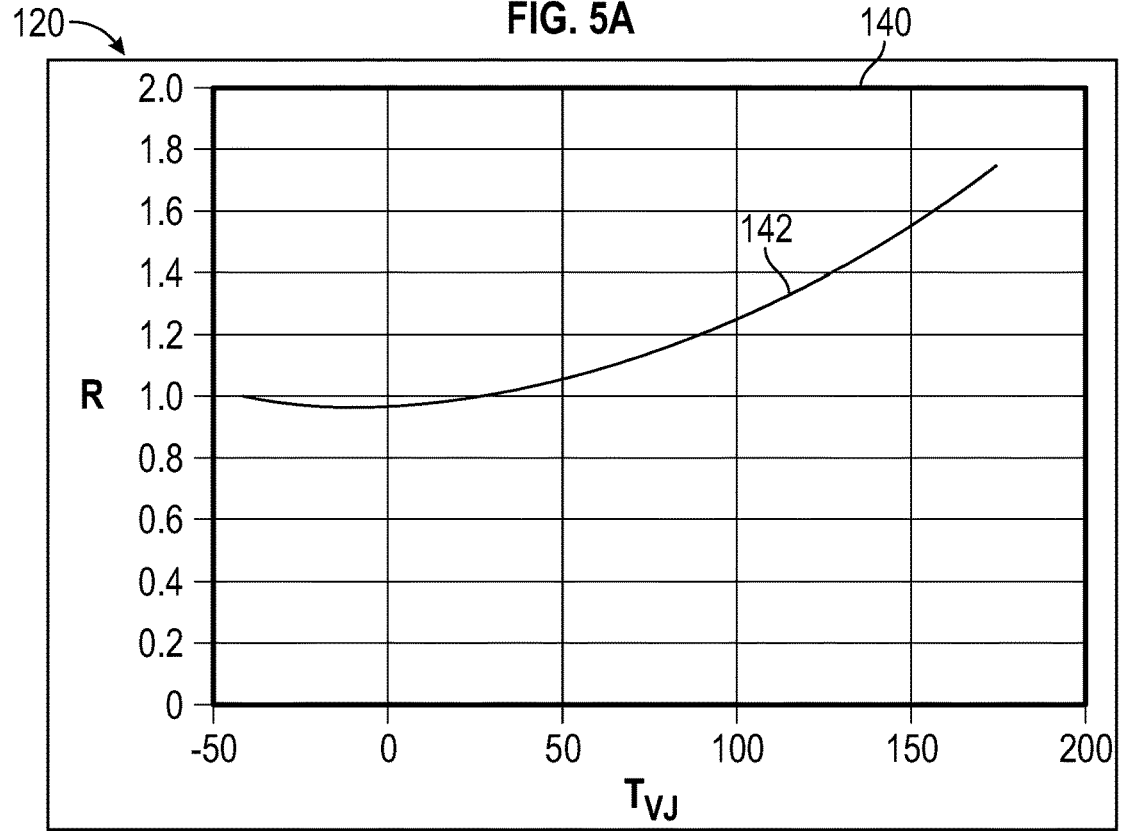
Figure 5C:
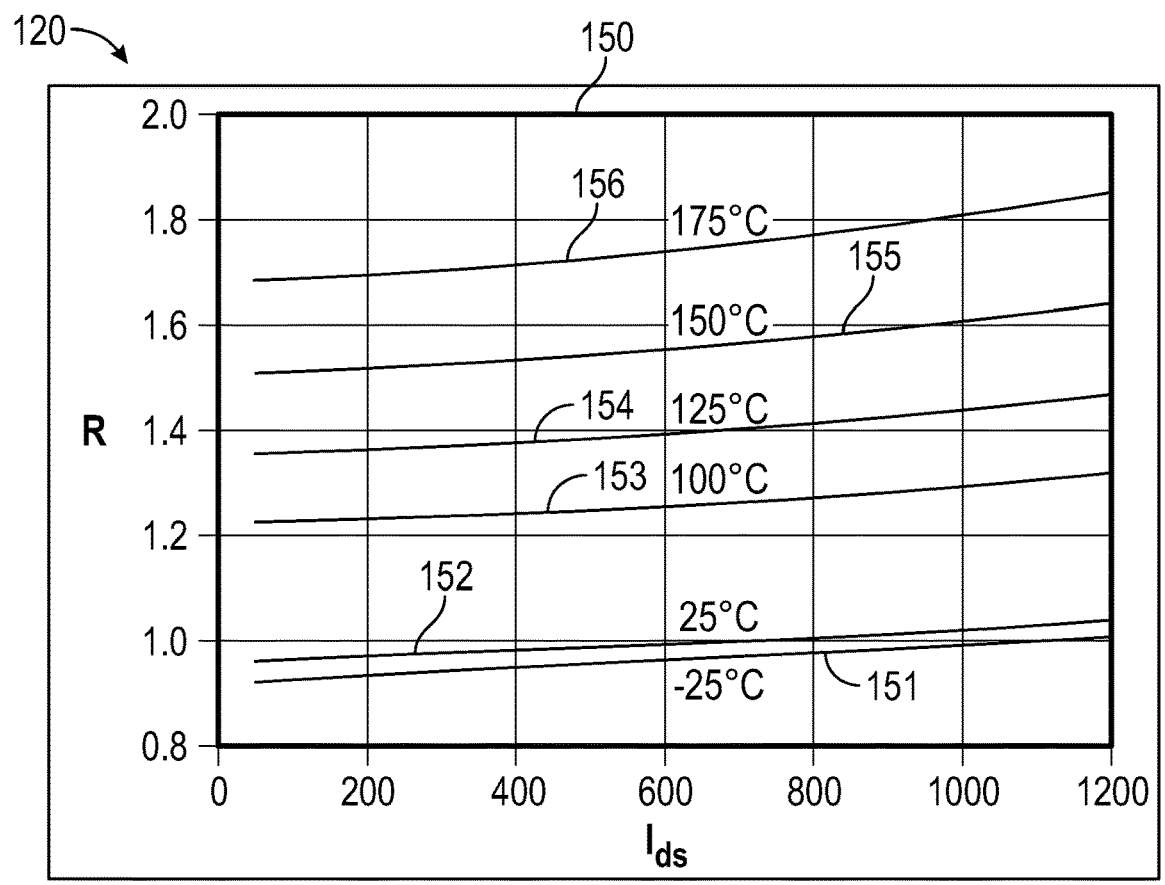

FIGS. 5A-5C show an example of the semiconductor model 120, which includes multiple individual models representing different electrical properties. In this example, the semiconductor model 120 includes a drain-source voltage Vds model represented by a graph 130 of Vds as a function of drain-source current Ids., as shown in FIG. 5A The graph 130 includes curves of showing Vds at a gate-source voltage Vgs of 15V. Curves 131-136 show this relationship at temperatures of 25 degrees Celsius (C), −40 degrees C., 100 degrees C., 125 degrees C., 150 degrees C. and 175 degrees C., respectively.

Referring to FIG. 5B, a junction temperature model describes the temperature in the junction region of a semiconductor switch, and is represented by a graph 140 of virtual junction temperature $T_{vj}$ as a function of resistance R when the switch is on (on-resistance). The graph 140 includes a curve 142 showing the temperature as a function of normalized on-resistance at a gate-source voltage Vgs of 15V, current of 760 Amps and a pulse width of less than about 300 µs.

A current model shown in FIG. 5C describes the drain-source current Ids and is represented by a graph 150 of Ids as a function of normalized on-resistance R at a gate-source voltage Vgs of 15V, and a pulse width of less than about 300 µs. Curves 151-156 show this relationship at temperatures of −25 degrees C., 25 degrees C., 100 degrees C., 125 degrees C., 150 degrees C. and 175 degrees C., respectively.

Figure 6:
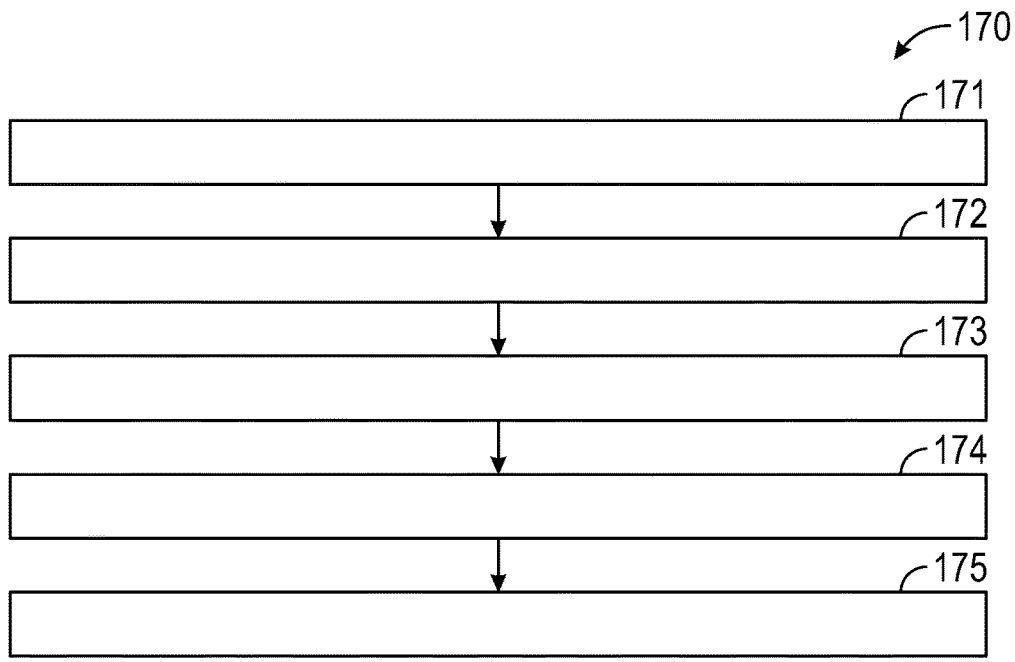
FIG. 6 is a flow diagram depicting aspects of a method of controlling a semiconductor switch, in accordance with an exemplary embodiment.

FIG. 6 illustrates embodiments of a method 170 of controlling switching speed of semiconductor switches in an electronic device. The method 170 is discussed in conjunction with controlling a vehicle and controlling switching speeds of an inverter, but is not so limited and can be applied to any suitable device or system having semiconductor switches.

Aspects of the method 170 may be performed by a processor or processors, such as the controller 76, a vehicle control unit and/or the computer system 42. It is noted the method 170 is not so limited and may be performed by any suitable processing device or system, or combination of processing devices.

The method 170 includes a number of steps or stages represented by blocks 171-175. The method 170 is not limited to the number or order of steps therein, as some steps represented by blocks 171-175 may be performed in a different order than that described below, or fewer than all of the steps may be performed.

At block 171, the processing device controls operation of one or more switches in an electronic device or component, such as the inverter 38. For example, during vehicle propulsion, a plurality of successive switching cycles are performed to generate AC current to each phase of the motor 20.

At block 172, at each switching cycle, the processing device calculates one or more protection parameters. In an embodiment, the protection parameters include a voltage threshold and a blanking time.

The blanking time allows for a sudden surge for a selected period of time before triggering protection. In other words, when an overcurrent or overvoltage condition occurs at a switch, the switch is turned off if the overcurrent condition lasts longer than the blanking time.

For example, as shown in FIG. 4, the processing device inputs operational parameters associated with propulsion (e.g., motor torque MT and rotational speed RS) to the maximum torque map 112, and a peak phase current is calculated. The peak phase current and a ripple current are derived using the model 116.

The operational parameters are also input to the power inverter loss model 114, along with other parameters or conditions relevant to inverter operation. Examples include coolant temperature CT, currents i, DC voltage V and temperature (e.g., die temperature DT). The power loss and thermal boundary conditions (e.g., maximum allowable temperature) are input to the thermal model 118, which is used to calculate the junction temperature. The peak phase and ripple current, and the junction temperature are used by the semiconductor model to estimate the voltage threshold $V_{th,DESAT}$ and blanking time. There may be different thresholds for different switches and/or different half-bridges.

Environmental conditions may be taken into account when selecting the voltage threshold. For example, the processing device may increase the voltage threshold in low temperature conditions (e.g., during winter) for further protection.

The protection parameters may be stored in any desired manner. For example, protection parameters are stored in a lookup table or calibration map accessible by the controller 76.

Calculated parameters can be provided to other components or systems of the vehicle, and/or provided to external locations. For example, parameters can be transmitted (e.g., wirelessly via a cloud or other network) to a workstation, server or other device connected to a network. This allows for remote monitoring of conversion devices, such as fleet monitoring (i.e., monitoring a group of vehicles). For example, the voltage threshold can be transmitted wirelessly for purposes such as monitoring the vehicle. For example, a fleet monitoring system can receive the voltage threshold from any number of vehicles, allowing the monitoring system to track fleet changes, aging and other aspects of the vehicle(s).

As discussed herein, the voltage threshold may be controlled, set or adjusted in various ways. For example, the voltage threshold can be adjusted by changing the charging current Ich, adjusting a computed internal comparator threshold or reference value, and/or by controlling a variable resistor. Blanking time can be changed by changing the charging current Ich and/or capacitance $C_{BL}$.

At block 173, based on the calculations, the protection circuit 82 is configured based on the protection parameters. For example, the variable current source is used to apply the charging current Ich (and/or control resistance $R_{DESAT}$ and/or capacitance $C_{BL}$) and establish a desired level of $V_{th,DESAT}$ and a desired blanking time.

At block 174, the processing device monitors switches during a switching cycle using, for example, the sensing circuit. At block 175, if the switch voltage exceeds the voltage threshold, the processing device initiates a shutdown or deactivation procedure.

In addition to direct control of overcurrent protection, the method 170 may include indirect control to address overvoltage that can occur due to shutdown of the switch under high current. In an embodiment, the deactivation process includes a soft current shutdown device that "softly" or slowly discharges the switch to prevent fast changes. For example, with an overcurrent threshold of about 10% above peak expected current, the tuning of gate driver can be fastest since any voltage spike due to smaller margin on overcurrent shutdown.

Figure 7:
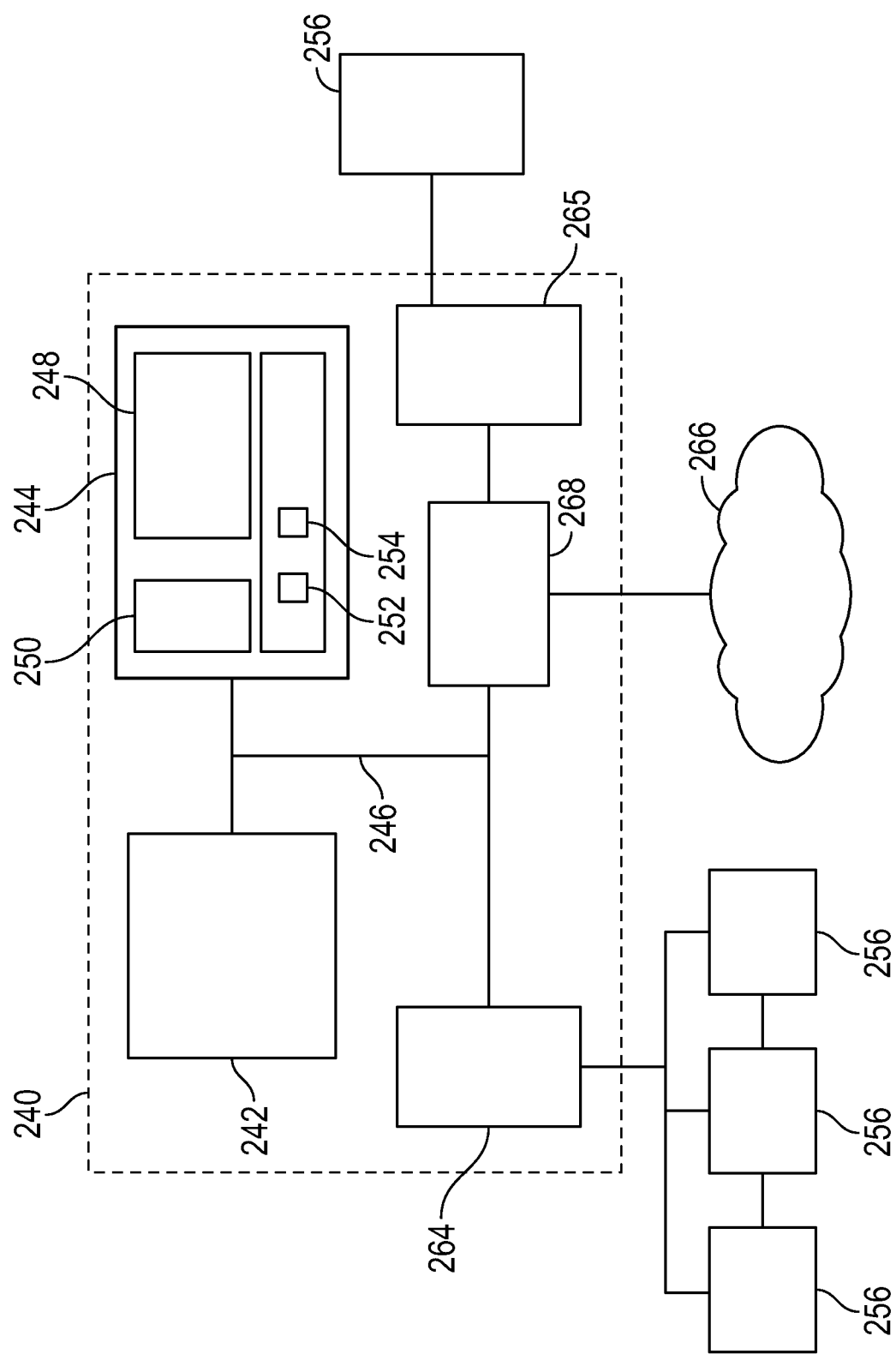
FIG. 7 depicts a computer system in accordance with an exemplary embodiment.

FIG. 7 illustrates aspects of an embodiment of a computer system 240 that can perform various aspects of embodiments described herein. The computer system 240 includes at least one processing device 242, which generally includes one or more processors for performing aspects of image acquisition and analysis methods described herein.

Components of the computer system 240 include the processing device 242 (such as one or more processors or processing units), a memory 244, and a bus 246 that couples various system components including the system memory 244 to the processing device 242. The system memory 244 can be a non-transitory computer-readable medium, and may include a variety of computer system readable media. Such media can be any available media that is accessible by the processing device 242, and includes both volatile and non-volatile media, and removable and non-removable media.

For example, the system memory 244 includes a non-volatile memory 248 such as a hard drive, and may also include a volatile memory 250, such as random access memory (RAM) and/or cache memory. The computer system 240 can further include other removable/non-removable, volatile/non-volatile computer system storage media.

The system memory 244 can include at least one program product having a set (e.g., at least one) of program modules that are configured to carry out functions of the embodiments described herein. For example, the system memory 244 stores various program modules that generally carry out the functions and/or methodologies of embodiments described herein. A module or modules 252 may be included to perform functions related to controlling operation of inverters and other conversion devices as discussed herein. A module or modules 254 may be included to perform functions related to determining protection parameters as discussed herein. The system 240 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 242 can also communicate with one or more external devices 256 as a keyboard, a pointing device, and/or any devices (e.g., network card, modem, etc.) that enable the processing device 242 to communicate with one or more other computing devices. Communication with various devices can occur via Input/Output (I/O) interfaces 264 and 265.

The processing device 242 may also communicate with one or more networks 266 such as a local area network (LAN), a general wide area network (WAN), a bus network and/or a public network (e.g., the Internet) via a network adapter 268. It should be understood that although not shown, other hardware and/or software components may be used in conjunction with the computer system 240. Examples include, but are not limited to: microcode, device drivers, redundant processing units, external disk drive arrays, RAID systems, and data archival storage systems, etc.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this invention belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A system comprising:
   an electronic device including a circuit having a semiconductor switch;
   a controller configured to control a gate driver connected to the semiconductor switch via a protection circuit, the controller configured to set a protection parameter including a voltage threshold representing a selected value of a voltage across the semiconductor switch, the protection parameter configured to cause the semiconductor switch to be deactivated in response to an overcurrent condition, the protection parameter selected based on a mathematical model of the semiconductor switch, the mathematical model representing a physical property of at least one of the electronic device and the semiconductor switch, wherein the mathematical model includes a physics-based semiconductor model, the semiconductor model prescribing a value of the protection parameter based on a temperature of the semiconductor switch, a phase of current applied to the semiconductor switch for controlling the semiconductor switch, and a ripple current.

2. The system of claim 1, wherein the electronic device is disposed in a vehicle, and the system is configured to wirelessly transmit the protection parameter to an external location for remote monitoring of the electronic device.

3. The system of claim 1, wherein the mathematical model includes a thermal model of a junction temperature of the semiconductor switch, and a torque speed model including a torque speed operating point.

4. The system of claim 1, wherein the controller is configured to update the protection parameter at each of a plurality of switching cycles.

5. The system of claim 1, wherein the protection parameter includes a blanking time.

6. The system of claim 5, wherein the controller is configured to select the blanking time by controlling at least one of a charging current and a capacitance of a capacitor.

7. The system of claim 1, wherein the protection parameter includes a threshold desaturation voltage of the protection circuit.

8. The system of claim 1, wherein the controller is configured to adjust the voltage threshold by controlling at least one of a charging current, a resistance of a variable resistor and an internal comparator threshold.

9. A method comprising:
   controlling a semiconductor switch of an electronic device during a switching cycle by a gate driver connected to the semiconductor switch via a protection circuit;
   monitoring a voltage across the semiconductor switch during the switch cycle, and comparing the voltage across the semiconductor switch to a protection parameter, the protection parameter including a voltage threshold representing a selected value of a voltage across the semiconductor switch;
   based on an overcurrent condition causing the voltage of the semiconductor switch to exceed the voltage threshold, deactivating the semiconductor switch, wherein the protection parameter is selected based on a mathematical model of the semiconductor switch, the mathematical model representing a physical property of at least one of the electronic device and the semiconductor switch, wherein the mathematical model is a physics-based semiconductor model, the semiconductor model prescribing a value of the protection parameter based on a temperature of the semiconductor switch, a phase of current applied to the semiconductor switch for controlling the semiconductor switch, and a ripple current.

10. The method of claim 9, wherein the electronic device is disposed in a vehicle, and the mathematical model includes at least one of a torque model and a power inverter loss model.

11. The method of claim 9, wherein the mathematical model includes a thermal model of a junction temperature of the semiconductor switch, and a torque speed model including a torque speed operating point.

12. The method of claim 9, further comprising updating the protection parameter at each of a plurality of switching cycles.

13. The method of claim 9, wherein the protection parameter includes a blanking time, the blanking time selected by controlling at least one of a charging current and a capacitance of a capacitor.

14. The method of claim 9, wherein the protection parameter includes a threshold desaturation voltage of the protection circuit.

15. The method of claim 9, wherein the electronic device is disposed in a vehicle, and the method further comprising wirelessly transmitting the protection parameter to an external location for remote monitoring of the electronic device.

16. A system of a vehicle, comprising:
an electronic device including a circuit having a semiconductor switch;
a gate driver connected to the semiconductor switch via a protection circuit; and
a controller configured to control the gate driver and set a protection parameter including a voltage threshold representing a selected value of a voltage across the semiconductor switch, the protection parameter configured to cause the semiconductor switch to be deactivated in response to an overcurrent condition, the protection parameter selected based on a mathematical model of the semiconductor switch, the mathematical model representing a physical property of at least one of the electronic device and the semiconductor switch, wherein the mathematical model is a physics-based semiconductor model, the semiconductor model prescribing a value of the protection parameter based on a temperature of the semiconductor switch, a phase of current applied to the semiconductor switch for controlling the semiconductor switch, and a ripple current.

17. The system of claim 16, wherein the electronic device is disposed in a vehicle, and the mathematical model includes at least one of a torque model and a power inverter loss model.

18. The system of claim 16, wherein the mathematical model includes a thermal model of a junction temperature of the semiconductor switch, and a torque speed model including a torque speed operating point.

19. The system of claim 16, wherein the protection parameter includes a blanking time, and the controller is configured to select the blanking time by controlling at least one of a charging current and a capacitance of a capacitor.

20. The system of claim 16, wherein the protection parameter includes a threshold desaturation voltage of the protection circuit.

* * * * *